United States Patent [19]

Gottsleben et al.

[11] Patent Number: 5,164,222

[45] Date of Patent: Nov. 17, 1992

[54] CVD METHOD FOR DEPOSITING A LAYER ON AN ELECTRICALLY CONDUCTIVE THIN LAYER STRUCTURE

[75] Inventors: Oliver Gottsleben; Michael Stuke, both of Gottingen, Fed. Rep. of Germany

[73] Assignee: Mas-Planck-Gesellschaft zur Foerderung der Wissenschaften e.V., Goettingen, Fed. Rep. of Germany

[21] Appl. No.: 548,996

[22] PCT Filed: Feb. 10, 1989

[86] PCT No.: PCT/EP89/00126

§ 371 Date: Jul. 20, 1990

§ 102(e) Date: Jul. 20, 1990

[87] PCT Pub. No.: WO89/07665

PCT Pub. Date: Aug. 24, 1989

[51] Int. Cl.[5] .................. B05D 3/02; B05D 3/14; B05D 3/06; C23C 16/00
[52] U.S. Cl. .................. 427/587; 427/250; 427/253; 427/255.1; 427/591; 427/593; 427/586
[58] Field of Search .................. 427/45.1, 46, 50, 51, 427/53.1, 249, 250, 252, 253, 255, 255.1, 255.2; 118/723, 724, 722, 725

[56] References Cited

U.S. PATENT DOCUMENTS

| | | | |
|---|---|---|---|
| 2,763,576 | 9/1953 | Belitz et al. | 427/46 |
| 3,167,449 | 1/1965 | Spacil | 427/46 |
| 4,183,320 | 1/1980 | Erben et al. | 427/50 |
| 4,239,819 | 12/1980 | Holzl | 427/253 |
| 4,349,408 | 9/1982 | Tarng et al. | 427/253 |
| 4,756,927 | 7/1988 | Black et al. | 427/253 |
| 4,794,019 | 12/1988 | Miller | 427/253 |
| 4,810,526 | 3/1989 | Ito et al. | 427/51 |
| 4,849,260 | 7/1989 | Kusumoto et al. | 427/253 |

FOREIGN PATENT DOCUMENTS 62-10275 1/1987 Japan.

OTHER PUBLICATIONS

Black et al, "Supplemental multilevel interconnects by laser direct writing . . ." *Appl Phys Lett, 50(15), Apr. 13, 1987 pp. 1016–1018.*

Primary Examiner—Marianne Padgett
Attorney, Agent, or Firm—Handal & Morofsky

[57] ABSTRACT

A method for depositing a layer of additional material onto an electrically conductive thin layer structure preferably by means of the thermally induced reason of a compound in the vapor state, in which the thin structure is heated by an electric current passed through it. The method is especially suitable for reinforcing metallic conductor structures which have been made on a substrate by a direct-writing-laser chemical vapor deposition method, for example, fine tungsten wires.

17 Claims, 2 Drawing Sheets

CVD METHOD FOR DEPOSITING A LAYER ON AN ELECTRICALLY CONDUCTIVE THIN LAYER STRUCTURE

TECHNICAL FIELD

The present invention relates to a method for depositing a layer of a given material onto an electrically conductive thin layer structure arranged on a substrate. Preferred embodiments employ the thermally induced reaction of a compound supplying said given material, which compound is in the vapor state or absorbed or deposited on the surface of the substrate. Such methods are known as chemical vapor deposition (CVD) methods. The invention also comprises an apparatus for carrying out such method.

BACKGROUND

It is known to produce a thin layer from a given material by the thermally induced deposition from the gaseous phase, with or without the thermally induced reaction of a compound in the vapor state to supply the given material. The chemical reaction may be a simple thermal decomposition or a reduction or any other suitable reaction. Such methods, known as CVD methods, recently acquired significance in the direct manufacturing of thin layer metal patterns, such as electric conductor structures on substrates, such as integrated circuit chips, etc., wherein the onset of the chemical reaction and thereby the definition of the metal pattern is performed by a laser beam focused onto the surface of the substrate. In a known "Direct-writing"-Laser-CVD Method (I. G. Black et al, Appl. Phys. Lett. 50 (15), Apr. 13, 1987, pp. 1016–1018), the pattern is deposited by the reduction of tungsten hexafluoride with hydrogen, whereupon metallic tungsten and hydrofluoric acid are formed.

It is frequently desired that such thin layer metallic structures, manufactured by direct-writing laser CVD methods or by other means, be reinforced, that is, the thickness of the metallic structures (counted perpendicularly with respect to the surface of the substrate) be reinforced by additional material, which additional material may be the same material as has been used in the primary layer structure or some other material. A similar objective may also occur for non-metallic, electrically conductive structures.

SUMMARY OF THE INVENTION

The present invention solves this problem by providing that the electrically conductive structure to be reinforced (the conductor structure) is subjected to heating by an electrical current passed therethrough in the presence of a vapor-phase chemical compound which, during a thermally induced chemical reaction, will supply the desired additional material to be deposited.

As a result of this selective and practically exclusive heating of the conductor structure by the Joule heat produced therein, a very well-defined deposit of the additional material settles exclusively onto the heated structure.

The heating occurs preferably as a result of a current passed through the electrically conductive structure to be reinforced, which current is sufficient to heat it and is applied to the conductive structure through electrodes placed thereon. The heating can be performed also by inductive means, such as by inducing a high frequency current therein.

The current flow occurs preferably in a pulsed fashion, whereby the conducting structure to be reinforced heats up very quickly and there is little time left for heat transfer to the substrate. Similar considerations apply also to inductive heating.

The gas atmosphere which, during the heating of the metallic or conductive structure by the current, is in contact therewith, preferably comprises a mixture of $WF_6$ and $H_2$, however, other types of gas atmospheres could be used, such as, $WCl_6/H_2$, $W(CO)_6$, $W(PF_3)_6$, etc. Regarding the deposition of tungsten by CVD, see, for example, the article of C. E. Morosanu et al, Thin solid Films, 52 )1978) 181–194.)

BRIEF DESCRIPTION OF THE DRAWINGS

The invention will now be described in a more detailed exemplary manner with reference to the drawings, which relate to a preferred application in which an electrically conductive structure is reinforced by metal.

BEST MODE FOR CARRYING OUT THE INVENTION

Figure 1:
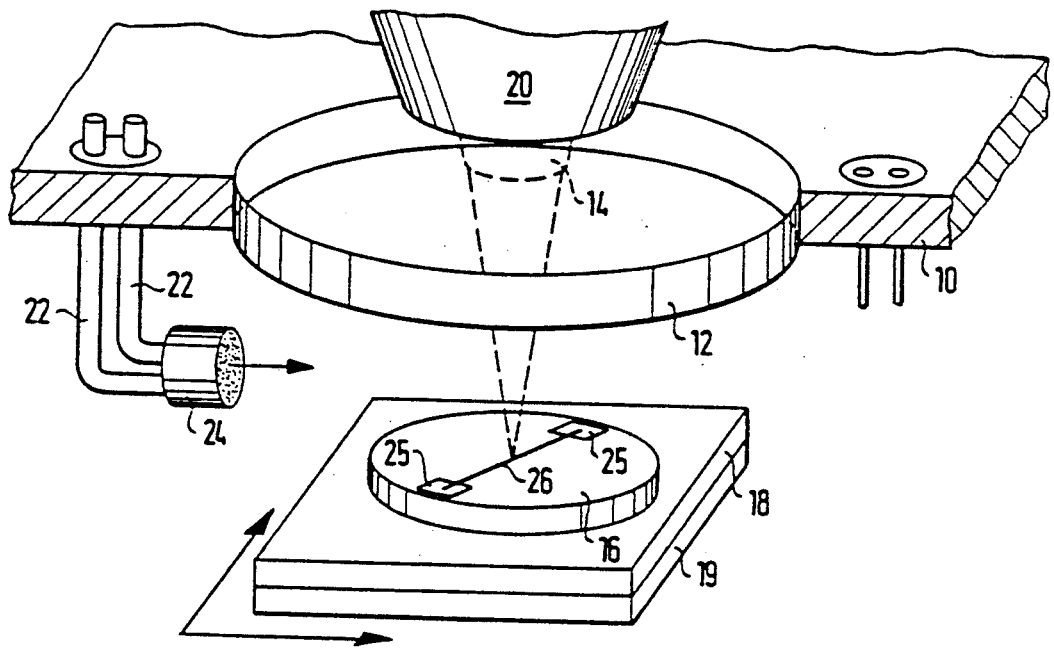
FIG. 1 illustrates in a simplified fashion a portion of an apparatus for making metal patterns by means of a laser-CVD.
Figure 2:
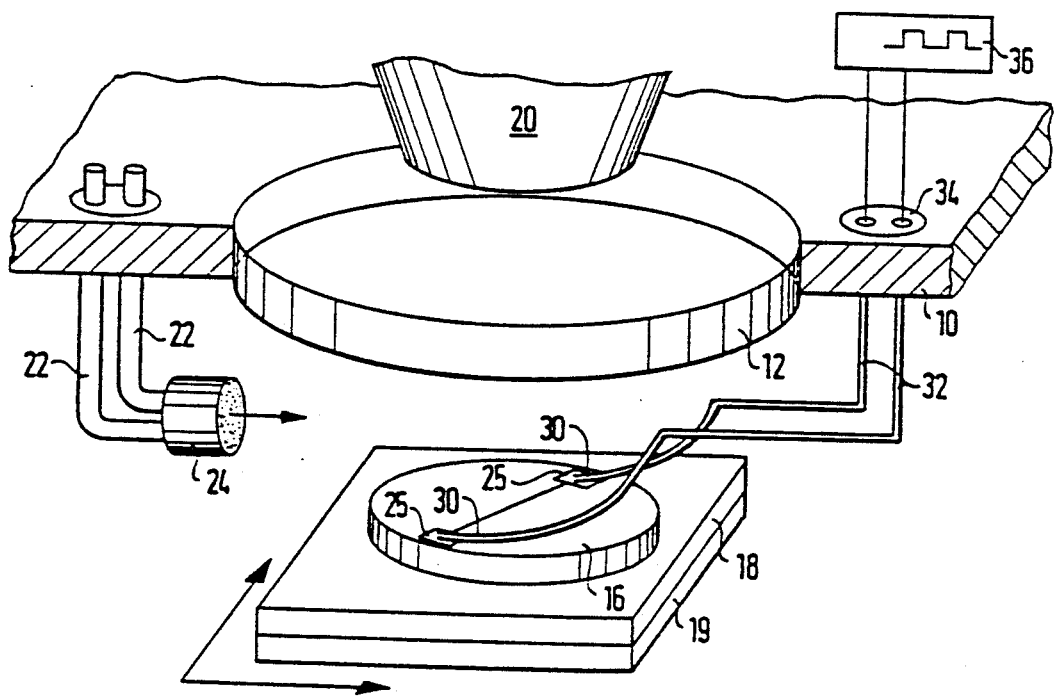
FIG. 2 is a schematic illustration of the apparatus according to FIG. 1 with an additional arrangement for the reinforcing of the metal structure produced by means of a laser-CVD.

FIGS. 1 and 2 illustrate in a schematic fashion the essential parts of an apparatus for performing a preferred form of the instant method of the present invention.

The apparatus illustrated in FIGS. 1 and 2 comprises a gas-tight metallic housing (10) having an optical window (12), through which a laser beam (14) is focused onto the surface of a substrate (16), which is arranged on a substrate support (18). In the illustrated embodiment, the laser beam has a wave length of 514.5 nm and is produced by an ionized argon laser (20). The housing (10) is further provided with a passage for two gas conduits (22), which connect a gas supply system not illustrated in the drawing, and which is outside the housing, with a mixing head (24) which is within the housing (10). In the exemplary embodiment which will be described herein, tungsten hexafluoride is supplied through one of the conduits (22), while hydrogen is supplied through the other conduit in a molecular relationship of $WF_6/H_2$ of 1:10 with a partial pressure in the housing of about 3 kPa (30 mbar) of $WF_6$ and 30 kPa (300 mbar) of $H_2$. The substrate (16) is a ceramic platelet made from 96 percent fine $Al_2O_3$ the surface of which is polished to a maximum roughness of about 250 nm. The surface is also cleaned with ethanol. In two regions which are spaced from each other by about 5 to 6 mm, terminal spots are formed by sputtering gold on it.

The substrate support (18) is a computer controlled microscope table having a position resolution capability of 0.25 μm and comprises a temperature control device (19) which is schematically illustrated, and is preferably a cooling device. A film of an organo-metallic or other suitable compound is placed on the surface of the substrate 16 for absorption, for condensation or for freezing out purposes. The laser beam (14) is focused with the help of a microscope objective to an operating distance of 8 mm and so that the laser beam output available on the substrate surface amounts to about 1.5 watts. Alternatively, the substrate support (18) can be provided with heating means.

With the above-described apparatus on the surface of the ceramic substrate (16) and by means of the focused laser beam, a strip-shaped tungsten conductor (26) was formed between the two terminal spots with a writing speed of about 250 μm/second. The specific resistance of the tungsten conductor (26) formed by laser-CVC was about 13-20 μOhm.cm which is higher than the specific resistance of 5.6 μOhm.cm of the solid tungsten. A measurement of the width of the tungsten conductor deposited through the laser-CVD, which measurement was limited by the resolution capability of the microscope optics, resulted in a half-width value of about 5-6 μm.

The linear conductor (26) deposited by laser-CVD can be reinforced while in the presence of the above-noted $WF_6/H_2$ reaction mixture by being heated by direct electrical current passing therethrough, so that onto the primary tungsten wire a further tungsten layer is deposited. For this purpose, both terminal spots are connected with the electrical terminals (30) which through connecting wires (32) passing through a passage (34) are coupled with a source of pulsating current (36). The pulsating current source (36) delivers short current pulses having high amplitudes. The duration, the repetition frequency and the amplitude of the pulses are selected so that the conductor structure which is to be heated, or the substrate, will not be damaged. A preferred pulsating direct current source (36) can deliver electric pulses having a fluctuating voltage peaking at about 30 volts, and a variable period from about 10 to 100 ms and a variable frequency of about 2 to 30 Hz. The duration of the pulsating current may amount from a few minutes up to about 20 minutes. The switching of the current or of the voltage can also be performed manually.

Figure 3:
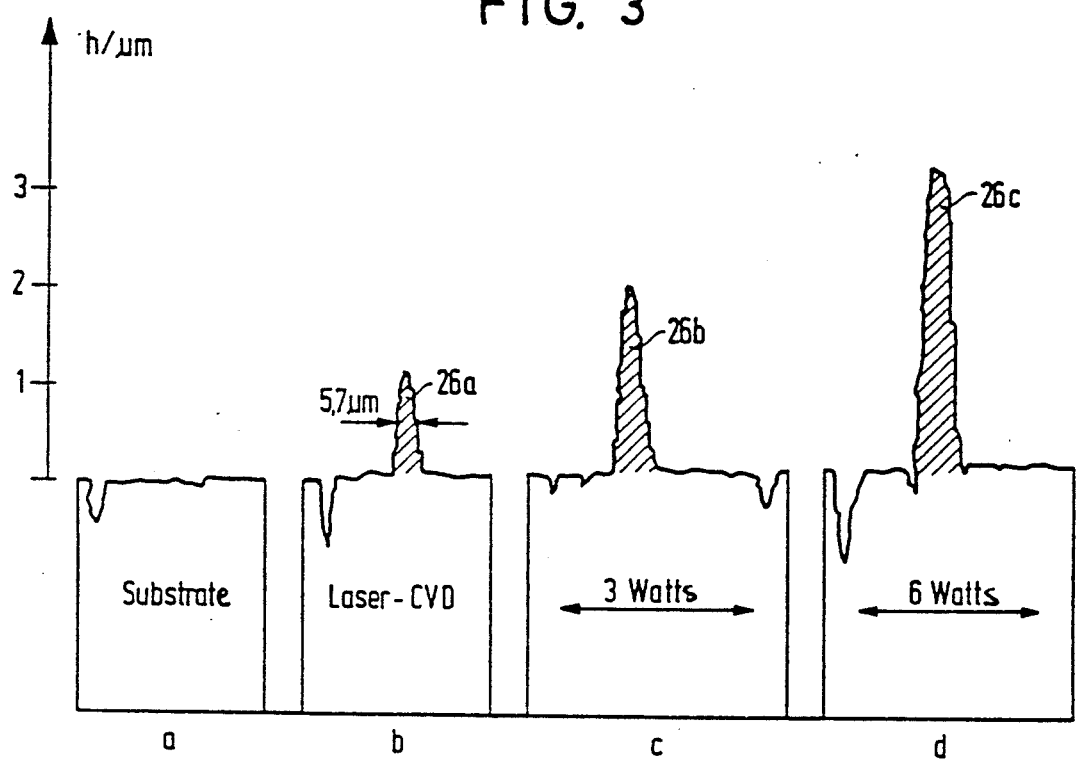
FIG. 3 is an enlarged profile cross-section of a linear electrical conductor, produced with the apparatus of FIG. 2.

FIG. 3 illustrates at "a" a cross-sectional profile of substrate (16) without any deposit, at "b" the cross-sectional profile of a conductor (26a) formed by a laser-CVD; at "c" of a cross-sectional profile (26b) of a conductor formed by the laser-CVD (corresponding to (26a)) after it was reinforced by being exposed to five minutes of current supply at an average output of 3 watts and at "d" a cross-sectional profile of a conductor formed by the laser-CVD, after being reinforced with a current passage of five minutes at an average output of 6 watts. During the above, a voltage of about 15 volts (3 watts) and of about 25 volts (6 watts) was manually switched to alternate it during an interval of five minutes during which a ten-second switched-on period alternated with a five seconds switched-off period.

The strength of the above-described reinforced conductor structure was found to be excellent. There was no tungsten deposit found adjacent the conductors heated by the current.

It is clear that the parameters of the above-described exemplary embodiment should not be interpreted in a limiting fashion since they can be changed according to the requirements of a particular need and research conditions. The reinforcing material doesn't necessarily have to be the same as the originally deposited metal, it can be another metal or an alloy and if desired, it can be a semi-conductor or an insulating material or also a ceramic high temperature super conductor. Also, a multi-layered structure can be made in the above-described fashion in which at the various heating steps, different vapor atmospheres are used. Also, instead of using a galvanic current, the heating can be performed by inductive means, or by eddy-current heating, for example, by high frequency means, provided that the metal pattern to be reinforced and the substrate permit this. The structure which is to be reinforced according to the above-described method may also comprise a non-metallic material, such as carbon (graphite), a semi-conductor material or an electrically conductive compound.

Special advantages were found when the tungsten conductive structure was reinforced with gold, while the atmosphere during the passage of current, and during the resulting heating of the conductor structure, comprised a commercially available organometallic gold compound (available from the firm Doduco KG).

I claim:

1. A method for depositing a layer of additional, reinforcing material onto an electrically conductive, metallic, thin layer structure arranged on a substrate between points of contact to which an electric current source is connected, said metallic structure forming a continuous current path therebetween said method comprising a thermally induced reaction of a compound capable of supplying said material from the vapor state which compound is in the vapor state and is in contact with a free surface of the thin layer structure, said method further comprising heating the thin layer structure by an electric current passed therethrough, to a temperature above that of the substrate.

2. The method according to claim 1 characterized in that the thin layer structure is formed by a direct writing-laser chemical vapor deposition method on the substrate.

3. The method according to claim 1 wherein said thermally induced reaction supplies a metallic deposit of said additional material.

4. The method according to claim 1 wherein said thermally induced reaction supplies an additional layer of the metal of the thin layer structure as said additional material.

5. The method according to claim 1 wherein said thermally induced reaction supplies a semi-conductor material as said additional material.

6. The method according to claim 1 wherein said thermally induced reaction supplies a dielectric material as said additional material.

7. The method according to claim 1, characterized in that it is performed at least twice using different compounds.

8. The method according to claim 1 or 2, wherein said additional material supplying compound is a volatile tungsten halogenide used in a mixture with hydrogen.

9. The method according to claim 8, wherein the proportion of tungsten halogenide to hydrogen is about 1:10.

10. The method according to of the preceding claim 1 wherein the thin layer structure is made from tungsten.

11. The method according to claim 1 which is a chemical vapor deposition method.

12. The method according to claim 1 wherein a pulsed current is used.

13. The method according to claim 8 wherein said tungsten halogenide is selected from the group consisting of $WF_6$ and $WCl_6$.

14. A method of preparing a reinforced substantially linear thin layer conductor comprising the steps of:
   (a) thermally inducing the deposit of additional material onto a free surface of a substantially linear, thin layer, metallic conductor supported on a non-conductive substrate to extend between points of contact to which an electric current source is connected, said metallic structure forming a continuous current path therebetween, said thermally induced deposit being effected by means of a chemical reaction with a vapor state compound capable of supplying said additional material; and
   (b) passing an electric current through said thin layer conductor to heat it above the temperature of the substrate, during said deposition
whereby said additional material is deposited substantially exclusively on said conductor in a well-defined manner.

15. The method of claim 14 further comprising a preliminary step of forming said metallic conductor by a direct-writing laser chemical vapor deposition method.

16. The method of claim 15 wherein said metallic conductor has a half-width value of about 5-6 μm.

17. A method for producing a reinforced metallic structure, said method comprising:
   a) providing an electrically conductive metallic thin layer structure on a substrate, said metallic structure being connected in an electric circuit for the passage of electric current therethrough;
   b) in a separate and subsequent step, depositing a reinforcing layer of additional material on to said thin layer structure by means of a thermally induced reaction of a compound in the vapor state which compound is capable of supplying said additional material from the vapor state and is in contact with a free surface of the thin layer structure; and
   c) electric induction heating of said thin layer structure to heat it resistively to a temperature higher than that of said substrate by passage of current therethrough, said heating causing deposition of said reinforcing material on said thin layer structure by reaction of said vapor state compound.

* * * * *